United States Patent

Reefman

[15] 3,636,469

[45] Jan. 18, 1972

[54] BEAT FREQUENCY TIME STANDARD

[72] Inventor: William E. Reefman, Santa Barbara, Calif.

[73] Assignee: The Bunker-Ramo Corporation, Oak Brook, Ill.

[22] Filed: Nov. 10, 1969

[21] Appl. No.: 875,428

[52] U.S. Cl. ................................331/41, 58/23 TF, 310/25, 318/54, 331/116 M, 331/156

[51] Int. Cl. ........................................................H03b 5/30

[58] Field of Search ...................331/41, 116 M, 15.6; 58/23; 318/54; 310/25

[56] References Cited

UNITED STATES PATENTS

| | | | |
|---|---|---|---|
| 1,841,489 | 1/1932 | Marrison | 331/41 |
| 3,024,429 | 3/1962 | Cavalieri, Jr. et al. | 331/156 |
| 3,441,753 | 4/1969 | Terayama | 331/116 |

*Primary Examiner*—John Kominski
*Attorney*—Frederick M. Arbuckle

[57] ABSTRACT

Two tuning forks, each resonant at a different frequency, are connected to generate a beat-frequency signal for a time standard. Each tuning fork is incorporated within the feedback loop of an electromechanical oscillator, the separate outputs of which are applied to a modulator. The difference or beat-frequency output signal of the modulator is used to drive an electric force transducer which, in turn, drives a clockwork.

The present invention relates to improvements in generating time standard signals for clockworks and more particularly to a two tuning fork system for generating a stable, low-beat frequency signal. Advantageously, the present invention utilizes the structural and physical characteristics of high "Q" tuning forks as described in my copending application, Ser. No. 843,923, filed July 23, 1969, for "Tuning Forks and Oscillators Embodying the Same."

3 Claims, 5 Drawing Figures

BEAT FREQUENCY TIME STANDARD

BACKGROUND OF THE INVENTION

In many electronic and electromechanical systems and devices there is a need for a highly stable source of electrical signals at some predetermined frequency. Where the desired frequency is low, in the order of 20 to 20,000 Hertz, it is difficult to produce a reliable oscillator that provides an accurate driving signal time base that may be used, for example, to drive a signal frequency dependent electromechanical clock or the like.

Conventional temperature compensated tuning forks can be fabricated with a sufficiently high "Q" or low loss and have been employed as the frequency-controlling element in the feedback circuit of an electronic oscillator circuit to provide a long term time base for driving such electric clocks. However, at the usually required low clock drive frequencies, conventional tuning forks are impractical because of their bulkiness and weight, particularly where it is necessary to package the clock drive together with the necessary electronics package, gear mechanism and dial assembly in a compact clock housing such as is employed in automobiles.

In my aforesaid application, Ser. No. 843,923, there are disclosed low cost mass producible high "Q" tuning forks which avoid many of the disadvantages of conventional prior art tuning forks and which may be advantageously incorporated within the feedback loop of an electromechanical oscillator system as the principal frequency controlling element thereof so as to provide a stable source of continuous electric signals at some predetermined signal frequency. As described in the aforesaid application the tuning forks may be stamped from a thin sheet of material and have a portion thereof removed to provide a tuning fork which is light in weight, dimensionally small and capable of being driven with very low power requirements at a low frequency within the range of 20 to 20,000 Hertz. Such tuning forks are particularly well adapted for incorporation into electric drive signal circuits employed in compact clocks such as, for example, those designed for use in automobiles.

Notwithstanding the aforementioned advantages of such flat tuning forks fabricated from thin sheets of material, such tuning forks are still subject to spurious vibrational forces such as are typically imposed upon a clock mounted in an automobile. In addition, the accuracy of such tuning forks when packaged with automobile clock mechanisms is effected by the environment. For example, environmental elements such as gravity, acceleration, humidity, temperature, barometric pressure, supply voltage and the like, interfere with the normal functioning of a tuning fork as the frequency controlling element in an oscillatory drive circuit and reduce the accuracy thereof.

For example, tuning forks are known to display a sensitivity to gravity such that the resonant frequency of a tuning fork is slightly higher when its tines are pointing downward toward the earth as opposed to when its tines are pointing upward or away from the earth. So long as a single tuning fork element is used, the effect of gravity cannot be compensated for except by designing the tuning fork with a resonant frequency slightly less than desired and arranging for its placement with the tines in the downward position or designing the tuning fork with a resonant frequency slightly higher than desired and arranging for its placement with the tines in the upward position. Obviously, such techniques which in effect put the cart before the horse only provide costly, stop gap measures and do not provide a practical or satisfactory solution to the problem.

Moreover, as noted, tuning forks display a sensitivity to other conditions such as acceleration, barometric pressure, humidity, temperature and variations in supply voltage to the associated oscillator circuit. Since these conditions act directly upon the fork, they affect the frequency of the basic drive signal and little can be done to counteract these effects in a single tuning fork system. On the other hand, in a dual tuning fork system according to the present invention, the individual effect on each tuning fork is cancelled or balanced, and the error components are not present in the beat or difference frequency output signal. The situation may arise where a greater effect can be observed on one of the tuning forks because of the different resonant frequencies. This, however, is at most a second order effect and in most situations is inconsequential from a practical standpoint.

It should be noted, however, that the simple expedient of using two tuning forks having identical temperature coefficients produces the same coefficient at the difference frequency. In accordance with the present invention in order to compensate for temperature changes, the ratio of the temperature coefficients of the two forks is made to be in inverse proportion to the frequencies thereof by, for example, controlling the degree of intrusion of the piezoelectric elements' thermoelastic properties.

In still further accordance with the present invention, enhanced operation of a dual tuning fork system is realized by establishing the resonant frequency of each fork at some different multiple of a common frequency and then providing means for mechanically and/or electrically coupling the two forks together to ensure isochronism of their difference frequency.

SUMMARY OF THE INVENTION

These and other disadvantages of prior art arrangements are overcome by the present invention which provides a practical, low cost, highly reliable and highly stable driving signal time base for self-contained frequency dependent electromechanical devices. Two tuning forks are utilized to produce a difference frequency which is lower than that of either individual fork to provide a system accuracy greater than either of the individual tuning forks.

More particularly, the present invention contemplates the use of two tuning forks, each of which is uniquely incorporated within the feedback loop of an electromechanical oscillator system as the principal frequency-controlling element thereof. The output of each oscillator provides a stable source of continuous signals, each at some predetermined different frequency. Each output signal is applied to a modulator stage to derive a highly stable beat frequency signal whose frequency is equal to the difference between the frequencies of the oscillator output signals. The beat frequency signal is used to drive an electric force transducer which, in turn, drives an electric clockwork.

In accordance with another embodiment of the present invention, a single amplifier is utilized to sustain oscillation. Unlike a two amplifier system wherein the amplifiers may be allowed to saturate and a square wave output is applied to the drive crystal, in a single amplifier arrangement, the amplifier must operate linearly so that the output contains only sine wave components having a minimum distortion.

Each tuning fork assembly is fabricated from a flat strip of material with the tines being formed by the removal of a portion of the material from the strip such that the longitudinal axis of each tine lies in a plane which is substantially orthogonal to the directions in which the tines move during normal operation of the fork. A compliant base portion readily responds to and actuates drive and pickup transducers and, for the purpose of reducing or cancelling spurious signals in the pickup transducer caused by unwanted ambient vibrational forces acting upon the fork, an auxiliary pickup is electrically connected in out of phase relationship to the main pickup.

By the present invention, a beat frequency signal is obtained using elements resonant at a much higher frequency then the desired beat frequency. Any influence acting to change the characteristic of one element also acts upon the other element and the effects of these changes can be balanced out or cancelled out. Thus, the beat frequency signal is highly reliable and due to the balancing effect of the system, the beat frequency can be made substantially independent of such factors as gravity, acceleration, barometric pressure, humidity and supply voltage. Also, by controlling the position of the transducers on the tuning forks, it is possible to control the frequency temperature coefficiency of each fork and minimize errors due to changes in ambient temperature.

Although the use of two resonant elements at higher frequencies to produce a lower beat frequency which becomes a more stable form of timing signal that that capable of being produced by a single element alone as aforesaid, it is contemplated in accordance with the present invention that still greater stability or isochronism may be realized by establishing the resonant frequency of each element at some different multiple of some common frequency and then both tailoring the frequency temperature coefficient of each element and establishing a controlled amount of electrical and/or mechanical cross-synchronism between the elements.

DESCRIPTION OF THE DRAWINGS

Many other advantages of the present invention will be apparent from the following description taken in connection with the accompanying drawings which are presented for the purpose of illustration, and are not intended to limit the invention, the scope of which is defined by the appended claims which particularly point out and distinctly claim the subject matter of the invention. In the drawings, wherein like characters identify like parts throughout the several views:

Figures 1, 4, 5:
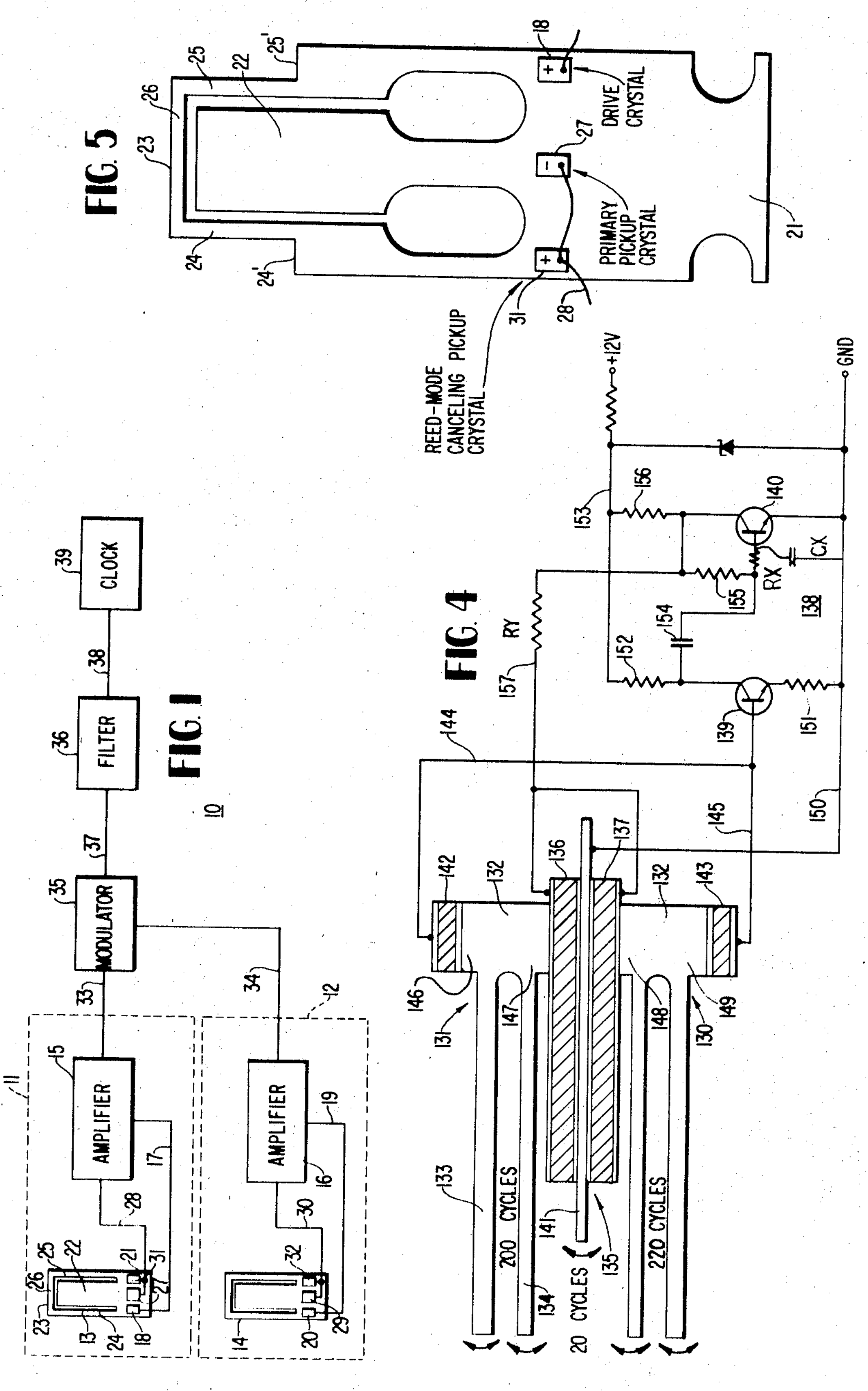
FIG. 1 is a block diagram of one embodiment of the present invention capable of providing a difference frequency drive signal which is lower than that of either tuning fork and which is of a higher accuracy as related to either of the individual tuning forks.
FIG. 4 is an alternate embodiment of the present invention using a single amplifier to sustain two tuning forks in oscillation.
FIG. 5 is a front elevational view of a tuning fork suitable for use in the present invention.

Referring now to the drawings, and in particular to FIG. 1, there is illustrated in block diagram form a beat frequency time standard system constructed in accordance with the present invention and generally indicated by reference numeral 10. The time standard system includes a first and a second electromechanical oscillator 11 and 12, outlined in rectangular blocks formed by broken lines, each of which includes its own tuning fork 13 and 14, and a corresponding amplifier 15 and 16. A feedback signal is taken from each amplifier and fed back to a drive crystal on the corresponding tuning fork to sustain oscillation. To this end, the feedback signal from amplifier 15 is applied through line 17 to drive crystal 18 affixed to the base of fork 13. The feedback signal from amplifier 16 is applied through line 19 to drive crystal 20.

Forks 13 and 14 are each similarly constructed from a flat sheet of thin metallic material and have removed therefrom a U-shaped strip. Referring to FIG. 5, an exemplary form of a tuning fork suitable for use in the present invention is illustrated. The resulting configuration of the strip comprises a rectangular base 21 from which there extends a central rectangular reed member 22 and a closely adjacent outer member 23. The central reed member forms one tine of the tuning fork, while the outer member comprising two spaced apart side arms 24, 25 and a connecting link or cross member 26 forms the other tine of the tuning fork. Both tines extend from the rectangular base 21 for vibration relative thereto along an imaginary line parallel to the plane of the tuning fork and passing through the points where the tines join the base.

While the tine configuration is shown as essentially rectangular, it will be readily apparent to those skilled in the art that variations of tine geometry may be employed to achieve a balance between the self-resonant frequencies of the inner and outer tines with a minimum of unbalance energy transmitted to the base so as to provide a high "Q" tuning fork. To this end, reference may be made to my aforesaid copending application, Ser. No. 843,923, which describes and illustrates several variations of tuning fork assemblies which may be advantageously employed in the present invention.

The basic frequency of the tuning forks 13 and 14 may be controlled through the selection of both the thickness of the material used and the compliance thereof, as well as by adjusting the lengths of the inner and outer tines. In accordance with the present invention, tuning fork 13 is constructed so as to have a frequency which is either lower or higher than that of fork 14, the difference being dependent on the desired frequency of the driving signal applied to the clock mechanism 39.

By way of example, tuning fork 13 may have a basic frequency of 360 Hertz, while tuning fork 14 may have a basic frequency of 400 Hertz. A suitable piezoelectric transducer 27 is positioned on base 21 near center tine 22 to act as a pickup or sensing transducer providing an output signal which is applied through conductor 28 to the input of amplifier 15. A similar piezoelectric transducer 29 similarly located on the base of tuning fork 14 provides an output signal applied through conductor 30 to the input of amplifier 16.

As hereinbefore described, a feedback signal is taken from each amplifier 15 and 16 and applied through its corresponding feedback path 17 and 19 to drive elements 18 and 20, respectively. Each drive element may be in the form of a piezoelectric transducer positioned on the base 21 of its corresponding transducer. Preferably, the drive transducer is positioned at the base of outer tine arm 25 to excite the tine into vibration.

In order to compensate for and minimize the effects of spurious vibrational forces, as for example the type which would be encountered if the tuning fork was used in a driving signal time base within a clock mounted in an automobile, an additional pickup crystal or piezoelectric transducer 31 and 32 may be provided on each tuning fork. Transducers 31 and 32 develop cancelling reed-mode signals. When the third transducer is used, the three piezoelectric elements on each fork are mounted as illustrated in FIG. 5 with the primary pickup crystals 27 and 29 being electrically connected to the corresponding reed-mode-cancelling pickup crystals 31 and 32.

Drive crystal 18 is mounted adjacent one edge of the fork under the corresponding outer arm 25 and the two pickup crystals 31 and 27 are mounted under the other outer arm 25 and center tine 22, respectively, as shown. Transducers 27 and 31 are connected together in parallel and thence to the input terminal of the amplifier through conductor 28. Tuning fork 14 includes a similar arrangement with pickup transducers 29 and 32 being connected together in parallel and thence to the input terminal of amplifier 16 through conductor 30. Transducers 27 and 31 and transducers 29 and 32 are of opposite polarity so that the respective signals produced thereby due to fork mode vibration will be of the same polarity and in phase.

Referring now to FIG. 1, amplifiers 15 and 16 associated with each of the two forks 13 and 14 are identical and provide feedback signals adapted to maintain both forks in constant oscillation. The outputs of amplifiers 15 and 16 are applied through circuit paths 33 and 34 to a modulator stage 35. The output of modulator 35 characteristically contains elements of the frequency signals of both tuning forks, the sum of the frequency signals of both tuning forks and the difference frequency signals of both tuning forks, as well as harmonics of these frequencies. Accordingly, suitable filter means 36 may be provided to filter out undesired frequency components of the modulator output signal applied through circuit path 37. The drive signal at the desired frequency is applied through circuit path 38 to drive an end device such as, for example, clock 39. Clock work 39 may of itself have sufficient filter characteristics to reject the higher frequencies of the modulated signal. In such instances, the filter 36 may be dispensed with and the modulated signal may be applied directly to drive the clock work.

Figure 2:
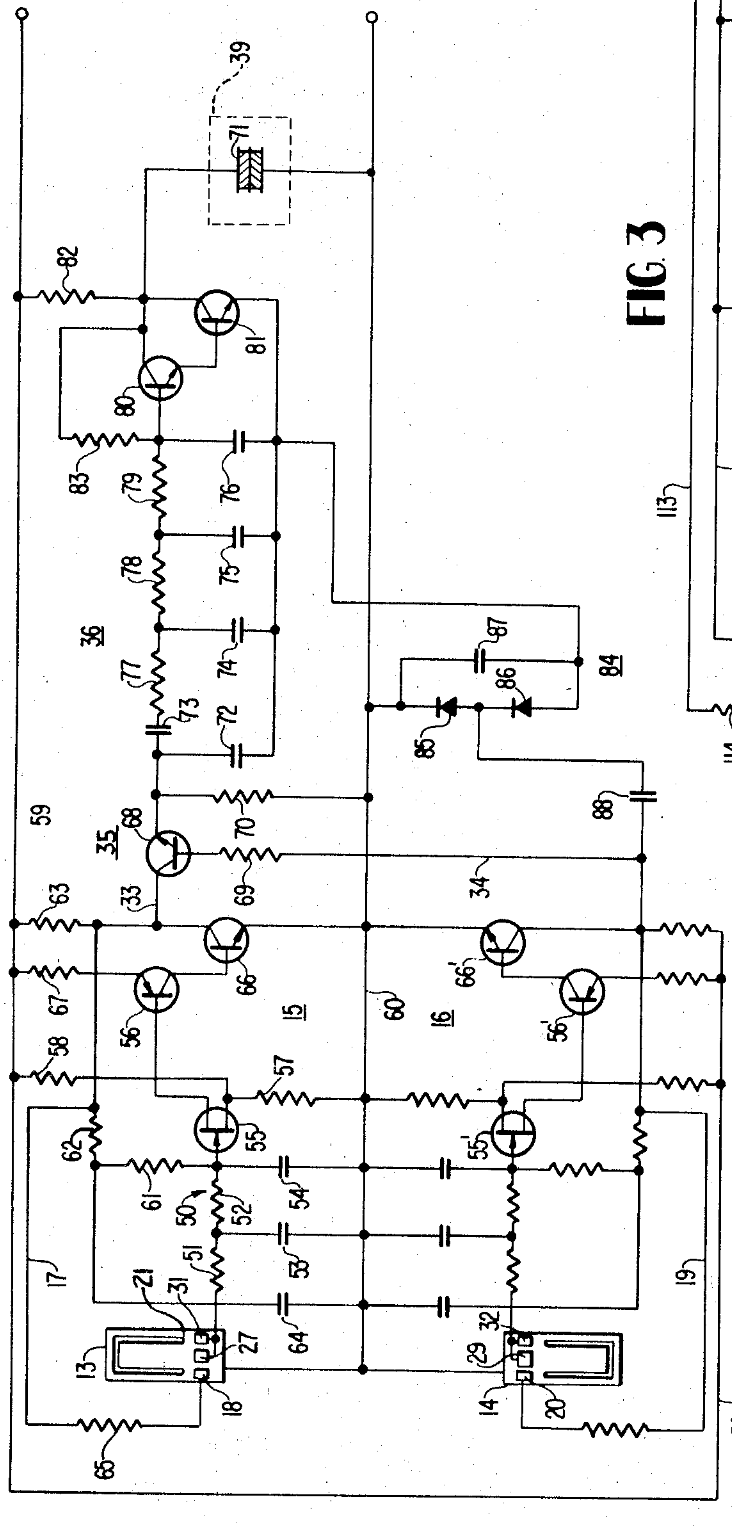
FIG. 2 is a schematic diagram of the block diagram system shown in FIG. 1.

Referring to FIG. 2, there is illustrated schematically an amplifier and modulator circuit corresponding to the block diagram arrangement illustrated in FIG. 1. Each tuning fork 13 and 14 is constructed in the manner hereinbefore described. Tuning fork 13 includes drive crystal 18 and two pickup crystals 27 and 31. Pickup 31 most remote from the root of the center tine provides for cancellation of the reed mode and strain coupled signals. Tuning fork 14 includes drive crystal 20 and two pickup crystals 29 and 32. Pickup 32 most remote from the root of the center tine provides for cancellation of the reed mode and strain-coupled signals.

Each electromechanical oscillator of the circuit shown in FIG. 2 is identical in operation, although operating at a slightly different frequency. Accordingly, in the interest of brevity, only one will be described and corresponding elements of the oscillator, when identified, will be referred to with a prime (') designation following the identifying numerical character. However, before describing the operation of the circuit, a brief description will be given with respect to the dynamics of piezoelectric transducers and the phase relations of the signal voltages in the piezoelectric tuning forks.

In any piezoelectric transducer, there is a 180° phase relationship in voltage between its use as a driver and as a pickup. A positive voltage applied to the positively poled surface of a crystal element results in contraction of the element in its length and width dimensions. Conversely, forcing the element to contract along these axes results in a negative voltage at the positive pole of the element.

Referring to FIG. 5, drive crystal 18 is attached such that the positive pole is exposed for the drive connection, and the primary pickup crystal 27 attached at the base of the center tine 22 has its minus pole exposed for connection. A positive voltage applied to the drive crystal 18 results in its contraction and the outer or driven tine is moved in an out-of-the-paper direction, i.e., toward the viewer. The center tine, due to the conservation of energy principle, will move in the opposite direction, in an into-the-paper direction, thus causing expansion of the primary pickup crystal and a negative voltage at its exposed surface. Although the tines are moving in the opposite directions, the pickup crystal 27 is poled opposite to that of the drive crystal 18, thus providing the same polarity or phase of pickup voltage as would a positively poled crystal located on the driven tine. Thus, there is a 180° phase reversal or polarity reversal in a crystal between its use as a driver and as a pickup.

The reed-mode-cancelling pickup 31 is poled positive, or opposite to the primary pickup crystal. Since it is located on an oppositely moving tine, its voltage will be in phase with the primary pickup voltage for fork mode vibration. When the fork is subjected to external vibration, the two tines tend to move in the same direction or reed mode motion. In this instance, the voltage generated by the two pickups are out of phase and cancel each other.

Another phenomena exhibited by piezoelectrically driven and sensed tuning forks is that the tine motion leads the drive voltage by 90°, as does the unloaded pickup voltage. This is occasioned by the fact that the drive piezoelectric material changes its geometry with an applied voltage and will retain this change in geometry as long as the applied voltage remains. When the drive voltage is removed, the stored mechanical energy of the piezoelectric element becomes the drive force for the opposite half cycle. Thus, it should be obvious that circuit variations in phase shift from the 90° electrical lag required to compensate for the 90° tine motion lead of the driven tuning fork results in a drive force being applied in opposition to the normal tine motion. Such a situation results in a change of amplitude of motion and a lower operating "Q" and a change in frequency.

Reference should now be made to FIG. 2 and the schematic of the amplifier circuit. As noted, in operation, the phase shift through the tuning forks at resonance will either lag or lead the drive voltage, depending on the polarity of the pickup voltages. In the illustrated embodiment, the phase shift lags the drive voltage by 90°. An additional phase lag of 90° is provided through phase shift network 50 comprising resistors 51, 52 and capacitors 53 and 54.

The output signal from the pickup crystals 27, 31 is directly coupled to the input of the phase shift network, the output of which is coupled to the gate electrode of a junction-type field effect transistor 55 which forms the first stage of the amplifier 15. Transistor 55 offers a high input impedance and thus avoids loading down the phase shift network. The output impedance of the first stage is low so as to enable a large power gain to be obtained, with little voltage gain. The low output impedance of the first stage matches the low input impedance of the second stage comprising transistor 56.

Thus, the first stage may be likened to an impedance matching device which provides a 180° phase shift for the signal passing through the stage. Bias conditions are partially established by resistors 57 and 58 forming a voltage divider connected between the positive bus 59 and common negative bus 60 and having its junction returned to the lower source terminal of transistor 55. Current through resistor 57 is modulated to some degree by transistor current which provides a negative feedback condition. This negative feedback condition reduces gain and raises the input impedance.

The gate electrode of transistor 55 derives a portion of its bias from the average DC voltage at the collector of transistor 66, through resistors 61 and 62. A filter capacitor 64 is connected between the junction of resistors 61 and 62 and the negative bus 60 to prevent alternating current feedback around the circuit.

The second stage provides an additional 180° phase shift. To this end, the base emitter junction of PNP-transistor 56 in combination with load resistor 67 form the load for the first stage. To this end, the base emitter junction and resistor 67 are serially connected to the upper drain terminal of transistor 55. Transistor 66 serves as a load for the second stage and has its base electrode directly coupled to the collector electrode of transistor 56. The emitter electrode of transistor 66 is returned to the negative bus 60 while the collector electrode is returned to the positive bus 59 through load resistor 63. The third stage provides substantially all of the amplification in the amplifier.

The output voltage of the amplifier is coupled from the collector electrode of transistor 66 and fed back through conductor 17 to drive crystal 18 in an in-phase condition to sustain oscillation. Due to the polarity of the pickup crystals, the output signal from the fork lags the drive signal by 90°, and an additional 90° phase lag is provided by the phase shift network, with an odd number of stages to establish the in-phase condition for the feedback voltage necessary to sustain oscillation. If the polarity of either the drive or pickup crystals was reversed, the output signal from the fork at resonance would lead the drive signal by 90°, in which case an even number of stages would be required in the amplifier, or the phase shift network would have to provide phase lead rather than phase lag.

The output voltage of the third stage is also utilized to bias the first stage due to the direct current coupling throughout the amplifier, and the fact that the phase shift through the three stages is 180° out of phase with the input to the first stage. To this end, the DC component of the feedback voltage is connected to the gate electrode of transistor 55 through resistors 61 and 62. The DC component is such that the bias voltages are stabilized for changing conditions of input voltage and for changes in ambient temperature. Capacitor 64 filters out the signal component of this voltage.

The square wave output of amplifier 15 is translated through circuit path 33 to the modulator stage 35 comprising transistor 68. Modulator 35 also has translated thereto through circuit path 34 the square wave output of amplifier 16. Specifically, the collector electrode of transistor 68 is connected to receive the output of amplifier 15, while the output of amplifier 16 is applied to the base electrode through resistor 69. Thus, current is allowed to pass through the modulator stage only when the output signals from the two amplifiers are coincidentally positive. When this condition is reached, a current flows in load resistor 70 connected between the emitter electrode and the negative bus.

The current is in the form of pulses and the train of pulses contains frequency components of the signal frequencies of both tuning forks, the sum of the signal frequencies of both tuning forks and the difference of the signal frequency of both tuning forks. Harmonics of these frequencies may also be present, but it is the difference frequency which is of importance, because it is used as a time standard signal for driving an electric force transducer which may be, for example, a piezoelectric bimorph crystal 91, which in turn drives a clock work 39.

Because of the presence of unwanted frequencies and the natural loss of amplitude in the detected signal, which results in a loss of total energy available to drive the transducer 71, filter and additional amplification means may be provided. Filter 36 comprises a network of capacitors and resistors 72–76 and 77–79 designed to filter out the unwanted higher frequencies. The output of filter 36 is connected to the input of a Darlington configuration amplifier stage comprising transistors 80 and 81. The common collector is returned to the positive bus 59 through the load resistor 82 and also to the input through resistor 83 to provide bias for the stage. The output is directly coupled to the bimorph crystal 71.

If the output signal of the Darlington configuration is insufficient to adequately drive the clock force transducer or bimorph crystal 71, the voltage supply to the Darlington circuit may be increased through the presence of a bootstrap power supply 84. Power supply 84 comprises a pair of serially connected diodes 85, 86 across which is connected capacitor 87. The junction of one side of capacitor 87 and the cathode of diode 85 is returned to the negative bus 60. The other side of capacitor 87 and the anode of diode 86 is connected to the emitter electrode of transistor 81. A coupling capacitor 88 couples a portion of the output signal from transistor 66′ forming the third stage of the amplifier to the junction of diode 85 and 86 serves as the power source to the bootstrap supply.

Figure 3:
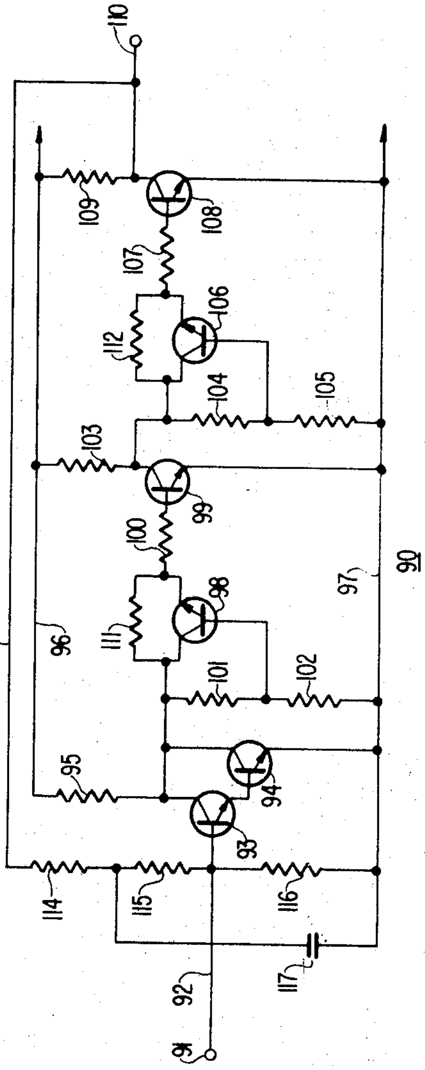
FIG. 3 is an alternate arrangement of an amplifier circuit which may be substituted for the amplifier circuit shown in FIG. 2.

Referring now to FIG. 3, there is an alternate embodiment of an amplifier arrangement comprising a three-stage gated amplifier 90 which may be used as a substitute for the circuit arrangement shown in 15 or 16 of FIG. 2. Amplifier 90 is DC coupled and provided with a DC feedback path of stabilize the bias conditions of all stages. The input signal to the amplifier is applied at terminal 91 and through conductor 92 to the first stage which comprises a conventional Darlington configuration formed by transistors 93 and 94. The common collector electrodes of transistors 93, 94 are returned through load resistor 95 to the positive bus 96, the emitter of transistor 94 being returned to the negative bus 97. The output of the first stage is gated through transistor 98 to the second stage formed by transistor 99. To this end, the base electrode of transistor 99 is returned through resistor 100 and the collector emitter junction of gating transistor 98 to the collector electrodes of transistor 94. The base of transistor 98 is connected to the junction of a voltage divider comprising resistors 101, 102 connected between the negative bus and collector electrodes of transistors 93, 94.

Gated coupling to the second stage is accomplished as follows: with a negative input signal, the Darlington configuration conducts less, decreasing the voltage drop across resistor 95 and causing the voltage at the common collector connections of transistors 93, 94 and 98 to increase. This increase in voltage is reflected at the junction of resistors 101 and 102 which drives gating transistor 98 into greater conduction, allowing current to the base electrode of the second stage 99 increasing its conduction. The increased current flow increases the drop across load resistor 103, thus reducing the voltage at the collector. The reduction is reflected at the junction of the voltage divider comprising resistors 104, 105, connected to the base of a second gating transistor 106. Decreased conduction of current through transistor 106 is applied through resistor 107 to the base electrode of third stage transistor 108. The output is taken from collector load resistor 109 through circuit path 110, which corresponds to conductor 33 of FIG. 2. Resistors 111 and 112 in shunt with transistors 98 and 106, respectively, provide temperature compensation. A DC feedback loop is provided by returning the output to the base of transistor 93 through conductor 113 and the voltage divider formed by resistors 114, 115, with resistor 116 forming one leg of the voltage divider circuit. Capacitor 117 connected across resistors 115 and 116 serves to bypass any AC components of the signal to prevent degenerative AC feedback from being applied to the input.

In order for the circuit to operate on very small input signals, each stage is biased to operate in its linear or quasilinear range. The forward resistance of gating transistor 98, in parallel with resistor 117 and both in series with resistor 100, serves to bias transistor 99 from the output collector voltage of the first stage Darlington configuration.

FIG. 4 illustrates another embodiment of the present invention wherein a single amplifier is used to sustain two tuning forks in oscillation simultaneously. To this end, two tuning forks 130 and 131 are provided, each being similarly constructed from a flat sheet of thin metallic material and having removed therefrom a strip of material. The operation of forks 130 and 131 is, however, different from the forks of the type shown in FIG. 5 in that the motion of the tines thereof is along paths which lie substantially in the same plane as the fork body. The resulting configuration of each fork includes a base section 132 and a pair of tines 133, 134. The tines of one tuning fork are somewhat shorter than the tines of the other such that each fork is resonant to a different frequency. By way of example, tuning fork 130 is made resonant at a frequency of 220 Hertz, while tuning fork 131 is made resonant at a frequency of 200 Hertz, to establish a difference frequency of 20 cycles.

The tuning forks are maintained in oscillation by electronic amplifier 138 comprising transistors 139, 140. The motion of the tines is sensed by pickup piezoelectric crystals 142, 143 mounted at opposite sides of adjacent tuning forks and connected in parallel through conductors 144 and 145 to the input on base electrode of transistor 139. The drive transducers for the tuning forks are in the form of a bimorph element 135 which protrudes well beyond the base area 132 where the drive actually occurs. To this end, the bimorph comprises a pair of piezoelectric drive elements 136, 137 mounted to opposite sides of a thin metallic laminate 141. The elements are bonded together by any suitable means such as epoxy, solder and the like. The protrusion formed by elements 136, 137 and 141 forms a bender element. Bending motion is obtained by polling one piezoelectric element opposite to the other such that when one contracts in length due to the polarity of the applied voltage, the other element expands. Likewise, pickup crystals 142, 143 are also reversed in polarity from the other so that the required phase relationship for oscillation of the circuit is made. The metal laminate or plate 141 which forms the center layer of the bimorph 135 protrudes beyond the end of crystals 136, 137 and forms the connecting link to the clockdrive. It should be noted, however, that the bending could be effected through use of single piezoelectric element bonded to the metal plate 140, but in such an arrangement the sensitivity of the bending element would be reduced by about one-half.

The areas at the bases of the tuning forks where the piezoelectric drive and pickup elements 136, 137 and 142, 143, respectively, are attached, protrude at right angles to the fork profile in the plane of the fork to provide four shoulders or steps 146, 147, 148 and 149. The height of these steps determines the degree of mechanical coupling between the piezoelectric elements and the tuning fork throat. The higher the step, the less the coupling. Thus, by controlling the height of the step (distance from the throat), the amount of intrusion of the piezoelectric elements' thermoelastic properties on those of the fork advantageously provide for temperature compensation. This is possible due to the great difference in the mechanical properties between the piezoelectric elements and the tuning forks and the fact that the piezoelectric elements exhibit relatively large negative thermal coefficients of elasticity.

It might be expected that since the forks are preferably stamped from the same sheet of material, any effects of temperature change on the two-fork system would be reflected in each fork and that these effects would balance out in the resultant difference beat frequency. However, this is not the case and it can be shown that the temperature coefficient of frequency ($Cf_o$) of a two-fork system is the same as the temperature coefficient of frequency of each of the forks themselves. For example, assume two frequency sources $f_1$ and $f_2$, having identical but finite temperature coefficients of frequency $C_1$ and having a difference frequency of $f_3$ at +20° C. Assigning the following values:

$$f_1 = 440 \text{ Hz.}$$
$$f_2 = 400 \text{ Hz.}$$
$$f_3 = 40 \text{ Hz.}$$
$$C_1 = -0.01\%/50° \text{ C.}$$

At room temperature the expression will be:

$$f_3 = f_1 - f_2 \text{ or}$$
$$440 \text{ Hz.} - 400 \text{ Hz.} = 40 \text{ Hz.}$$

If the temperature is lowered by 50° C. to −30° C., the expression becomes:

$$f_3 = [f_1 + (f_1 \times C_1)] - [f_2 + (f_2 \times C_1)] \text{ or}$$

$$f_3 = (440 + .044) - (400 + .04) = 40.004 \text{ Hz}$$

Hence we find that $f_1$, $f_2$, and $f_3$ have each increased by 0.01 percent.

If it is desired to keep $f_3$ constant, the temperature coefficient of the higher frequency source must be reduced by the ratio of the two frequencies, i.e., 400/440; hence the expression for zero temperature coefficient of $f_3$ will be:

$$f_3 = \left[f_1 + \left(f_1 \times C_1 + \frac{400}{440}\right)\right] - [f_2 + f_2 \times C_1)]$$

Assuming the above conditions and substituting values for $t = -30°$ C., we have:

$$f_3 = [440 + (0.044 \times 400/440)] - [400 + 0.04] \text{ or}$$
$$f_3 = 440.04 - 400.04 = 40 \text{ Hz.}$$

This shows a zero temperature coefficient for $f_3$ with finite and different coefficients for $f_1$ and $f_2$.

Thus, in a time base system utilizing the beat frequency between two tuning forks, the present invention contemplates making the ratio of the temperature coefficients of frequency exhibited by the two forks inversely proportional to the ratio of resonant frequencies exhibited by these forks. The ability to control the effects of crystal intrusion plays an important part in temperature stability. To this end, the pairs of tuning forks are preferably fabricated from the same stock using adjacent pieces of metal heat treated together to impart the same temperature coefficient to each. In the preferred embodiment, the higher frequency fork is provided with a lower temperature coefficient by controlling placement of the crystal location and the degree of intrusion of the piezoelectric elements' thermoelastic properties into the thermoelastic properties of the tuning fork. The temperature coefficient of the individual fork pair may either be positive or negative, so long as the higher frequency fork has a temperature coefficient that is lower than the low frequency fork with a ratio of such coefficients being the inverse of the ratio of the two resonant frequencies of the forks.

The degree of coupling, i.e., coefficient of instrusion of the piezoelectric elements to the fork is related to the distance that they are mounted from the throat of the fork. The further down the base that the piezoelectric elements are mounted, the lesser the degree of coupling. Thus, for fork pairs having a negative coefficient, the higher frequency fork must have a less negative coefficient and the piezoelectric elements are mounted more remote from the throat of the fork. Conversely, with fork pairs having a positive coefficient, the higher frequency fork has a less positive coefficient, with its piezoelectric elements being mounted less remote from the throat of the fork. It will, of course, be appreciated that where at least one of the two tuning forks are electromagnetically driven and/or sensed (as shown in the aforementioned pending patent application) the magnetic driving and sensing structures employed therefore will have temperature coefficients of reversible magnetic remanence which in turn will intrude upon the frequency temperature coefficient of the fork. Hence, by properly adjusting the magnetic remanence temperature coefficient of such driving and sensing structures and their degree of coupling to the fork the overall frequency temperature coefficient of the fork may be tailored in the manner contemplated by the present invention.

It should be noted that the frequency of tuning forks is dependent, to a small degree, on the position of the fork due to gravity acting on the tines. When the tines point down, gravity contributes to the restoring force thus causing an increase in frequency. In the up position, the system yields a lower frequency. However, the difference frequency remains constant for any position when the two forks are mounted such that all tines point in the same direction. Likewise, the changes or variations in frequency experienced in a single tuning fork due to changes in the mass of air load upon changes in altitude or humidity, as well as variations due to changes in supply voltage drive levels, are cancelled at the difference frequency.

Referring again to FIG. 4, the input to the electronic amplifier 138 which sustains the two forks in oscillation, simultaneously is taken from pickups 142, 143 in parallel and applied to the base of transistor 139, the emitter of which is returned to ground bus 150 through resistor 151. Resistor 152 is connected between the collector of transistor 139 and positive bus 153. The output of the first stage is coupled through capacitor 154 to transistor 140 which has its emitter electrode grounded and its base and collector electrodes biased through resistors 155 and 156, respectively, and connected to positive bus 153. Fork drive voltage is applied through circuit path 157 to the bender piezoelectric elements 136 and 137 which also serve as fork drive transducers. Each fork oscillates at its own frequency, thus providing a drive voltage to the bimorph 135 consisting of both frequencies. Since the drive voltage has a DC component applied from the junction of resistors 155 and 156, the drive voltage takes the form of a modulation envelope having a difference frequency component that is utilized to drive an end device having a coinciding resonant frequency.

It should be noted that the requisite 90° of phase lag is cumulatively provided at two places in the circuit. A portion of the 90° phase lag is provided by the network comprised of RX and CX at the input to the amplifier, while the remainder is provided by resistor RY and the capacitive reactance of the bimorph elements 136 and 137. It should also be noted that a linear system is required to allow simultaneous oscillation at two frequencies, such that simultaneous peaks of output voltage from the two sources do not result in a total voltage swing that is greater than the linear capabilities of the output stage 140.

Still further with respect to the embodiment of the invention shown in FIG. 4, it will be appreciated that since the tuning forks 130 and 131 are mechanically coupled with one another through the bimorph 135 and electrically coupled with one another by reason of their commonality within the associated amplifier circuit the action of one fork will to some extent influence the action of the other fork. Accordingly, in accordance with the present invention the aforesaid mechanical and/or electrical coupling can be advantageously exploited by establishing the frequency of each of the forks at some multiple of a common frequency. As is shown in the drawing, fork 133 may be established at the 10th harmonic of 20 Hertz while the resonant frequency of fork 130 is established at the 11th harmonic of 20 hertz to produce a beat frequency of 20 hertz. It can, therefore, be seen that if the frequency temperature coefficient of one of the two forks is made generally positive and the frequency temperature coefficient of the other of the forks is made generally negative, the mechanical and electrical cross-synchronization of the forks will thereby tend to produce a highly stable beat frequency over a relatively wide range of ambient temperatures.

There has thus been described a novel beat frequency time standard system employing two tuning forks arranged to generate a beat frequency signal.

What is claimed is:

1. Apparatus for generating a time standard signal comprising a first and a second oscillator including, respectively, a first and a second tuning fork each resonant at a different frequency, each tuning fork comprising a planar member having metallic tine members integral with a base portion, that one of said tuning forks which is resonant at frequency higher than the resonant frequency of the other fork having a temperature coefficient of frequency that is lower than the temperature coefficient of frequency the other tuning fork by the ratio of the two frequencies, and means for sustaining said tuning forks in an oscillating condition including means connected to said first and said second tuning forks for developing a time standard signal having a frequency corresponding to the difference in frequency between the first and the second tuning forks, said means for sustaining oscillations including a pair of piezoelectric drive crystals mechanically coupled to each other and to oppositely disposed base portions of said tuning forks, and driven by said standard time signal.

2. Apparatus as set forth in claim 1 further including a metal laminate mounted between said piezoelectric crystals, said crystals protruding beyond the base portion in the direction of the tines, said laminate protruding beyond said crystals in the direction of the tines, and pickup crystals mounted on the base portions of said tuning forks at the sides thereof opposite to said drive crystals.

3. Apparatus as set forth in claim 2, wherein said means connected to said first and second tuning forks comprises an amplifier, circuit means connecting the input of said amplifier to the output of said pickup crystals, and feedback means connecting the output of said amplifiers to said pair of piezoelectric drive crystals.

* * * * *